US006703276B2

(12) United States Patent
Alok et al.

(10) Patent No.: US 6,703,276 B2
(45) Date of Patent: Mar. 9, 2004

(54) PASSIVATED SILICON CARBIDE DEVICES WITH LOW LEAKAGE CURRENT AND METHOD OF FABRICATING

(75) Inventors: Dev Alok, Danbury, CT (US); Emil Arnold, Chappaqua, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/055,382

(22) Filed: Jan. 22, 2002

(65) Prior Publication Data

US 2002/0121641 A1 Sep. 5, 2002

Related U.S. Application Data

(62) Division of application No. 09/455,663, filed on Dec. 7, 1999, now Pat. No. 6,373,076.

(51) Int. Cl.[7] .......................................... H01L 31/0256
(52) U.S. Cl. ....................................... 438/268; 438/931
(58) Field of Search .......................... 438/931, 92, 167, 438/180, 181, 184, 906

(56) References Cited

U.S. PATENT DOCUMENTS 5,459,089 A  * 10/1995  Baliga ........................ 438/167
5,612,232 A  *  3/1997  Thero et al. ................. 438/571
5,635,412 A  *  6/1997  Baliga et al. ................ 438/520
5,776,837 A  *  7/1998  Palmour ...................... 438/767
5,914,499 A  *  6/1999  Hermansson et al. ......... 257/77
5,950,076 A  *  9/1999  Baliga ........................ 438/142

FOREIGN PATENT DOCUMENTS

DE          19507130 A1  * 10/1996   ......... H01L/23/029
EP           0380340 A2  *  1/1990   ........... H01L/29/91

* cited by examiner

Primary Examiner—Angel Roman
(74) Attorney, Agent, or Firm—Aaron Waxler

(57) ABSTRACT

Semiconductor power devices with improved electrical characteristics are disclosed including rectifying contacts on a specially prepared semiconductor surface with little or no additional exposure to other chemical treatments, with oxide passivation and edge termination at a face of the semiconductor substrate adjacent to and surrounding the power device. The edge termination region is preferably formed by implanting electrically inactive ions, such as argon, into the substrate face at sufficient energy and dose to amorphize a portion of the substrate face and preferably self-aligned to the device. The passivated, edge-terminated devices exhibit improved characteristics relative to passivated devices with characteristics approaching those of the native semiconductor with the additional advantages of passivation protection. Methods for making and using the devices are also disclosed.

14 Claims, 5 Drawing Sheets

PASSIVATED SILICON CARBIDE DEVICES WITH LOW LEAKAGE CURRENT AND METHOD OF FABRICATING

This is a divisional of application Ser. No. 09/455,663, filed Dec. 7, 1999, and issued on Apr. 16, 2002 as U.S. Pat. No. 6,373,076.

BACKGROUND OF THE INVENTION

1. Field of the Invention

The present invention relates to passivated semiconductor devices such as SiC devices and to methods for fabricating same.

More particularly, the present invention relates to passivated semiconductor devices such as SiC devices, wherein the semiconductor device has treated area(s) or edge(s) in the semiconductor aligned with the edge of an electrical contact layer, and to methods for fabricating and using same.

2. Description of the Related Art

Power devices are widely used to carry large currents and support high voltages. Since the early 1950's, developers of electronic power systems began to base their power systems on semiconductor devices. Presently, many types of power semiconductor devices are available including, but not limited to, power rectifiers, power bipolar transistors, power field effect transistors, power bipolar/field effect devices, power thyristors and other two, three or more terminal semiconductor devices.

Most power semiconductor devices being marketed today are fabricated in monocrystalline silicon. However, as is known to those skilled in the art, monocrystalline silicon carbide is particularly well suited for use in semiconductor devices and, in particular, for power semiconductor devices. Silicon carbide has a wide energy bandgap, high melting point, low dielectric constant, high breakdown-field strength, high thermal conductivity, and high saturation electron drift velocity compared to silicon. These characteristics would allow silicon carbide power devices to operate at higher temperatures, higher power levels, and with lower specific on-resistance than conventional silicon based power devices. Such devices must also exhibit low reverse leakage currents. Large reverse leakage currents cause premature soft breakdown.

Schottky barrier diodes with a breakdown voltage of approximately 1000 V, a low forward voltage drop of approximately 1.3 V at 100 A/cm$^2$, and reverse leakage current of approximately 0.1 mA/cm$^2$ at 1000 V have been produced from 4H—SiC by a technique which included forming the Schottky contact layer on a specially prepared surface of SiC. Such diodes were unpassivated [1].

Surface passivation is needed for any semiconductor device to protect it from its external environment and for obtaining stable and repeatable electrical characteristics. Without surface passivation, the characteristics of devices such as diodes or rectifiers can be easily influenced by ambient moisture and impurities and thus become unstable.

Schottky barrier diodes, passivated using a variety of dielectrics (e.g., thermally grown or deposited oxides), have forward current voltage characteristics substantially the same as those of unpassivated devices, but have leakage currents orders of magnitude higher than above-mentioned unpassivated devices. The increase in leakage current is thought to be due to the presence of positive charges in the passivation dielectric, which causes the electric field crowding near the edge of the diode.

It is known that large leakage currents in the area surrounding the edges of SiC devices can be reduced by an appropriate edge termination treatment at the periphery of the active contact or rectifying junction. One edge-termination technique, particularly suited to SiC diodes, has been taught by Baliga and Alok [2] and by Alok and Baliga [3]. The technique, which involves ion implantation at the edge of the rectifying junction, improves the breakdown voltage of unpassivated Schottky barrier diodes over that of similar devices without such edge termination [2,3].

A method of fabricating SiC devices with an ion implanted edge termination and oxide passivation was described by Bhatnagar et. al. [4]. According to their teaching, the passivating oxide is first deposited over, and then removed from, the area of the device where the rectifying contact is eventually formed. Since it is difficult or impossible to remove all traces of the chemical substances that have come in contact with the semiconductor surface during such processing, the diodes are likely to exhibit sub-optimal electrical characteristics.

SUMMARY OF THE INVENTION

It is therefore an object of this invention to provide passivated silicon carbide devices with improved electrical characteristics.

It is another object of the invention to provide a passivated SiC semiconductor device with low reverse leakage currents.

It is still another object of the invention to provide a passivated silicon carbide device with near theoretical breakdown voltages and low reverse leakage currents.

It is another object of the invention to provide a method of fabricating such devices.

In the present invention, ion-implanted (hereafter referred to as ion-treated) edge termination was found to reduce the parasitic leakage current due to passivation of the Schottky barrier diode and, at the same time, maintain or actually improve the breakdown voltage of such diodes relative to unpassivated, unterminated Schottky barrier diodes.

According to the present invention, a SiC semiconductor device is characterized by the combination of an electrical contact layer, formed on an ultra-clean surface of a monocrystalline SiC semiconductor layer, the surface pretreated as described herein, and which has received no additional exposure to other chemical treatments or materials, an ion-treated area aligned with an edge of the contact, and a passivation layer extending from a position at or near the edge of the junction and covering all or a portion of the surface. The electrical contact layer may be a rectifying (Schottky) contact or a contact for a rectifying junction. The device can also include an Ohmic-contact layer on a second surface of the device.

According to a preferred embodiment of the invention, the ion-treated area extends out a distance D of at least 5 $\mu$m from the edges of the contact layer.

The present invention also provides a method for fabricating the devices of this invention. The method includes the steps of:

(1) forming a patterned electrical contact layer on a pretreated portion of a first surface of a semiconductor layer; (2) ion-treating an area of the layer aligned with an edge of the contact layer; (3) forming a patterned passivation layer on and covering the first surface of the layer; and (4) forming openings in the passivation layer exposing a portion of the electrical contact layer.

The present invention provides semiconductor devices with near-theoretical breakdown voltages and low leakage currents. It is believed that these superior characteristics are due in part to the formation of the electrical contact layer on a specially prepared surface of monocrystalline SiC, as described herein, and which has received no additional exposure to other chemical treatments (hereafter referred to as ultra-clean surface).

DESCRIPTION OF THE DRAWINGS

The invention can be better understood with reference to the following detailed description together with the appended illustrative drawings in which like elements are numbered the same.

DETAILED DESCRIPTION OF THE INVENTION

Figure 1A:
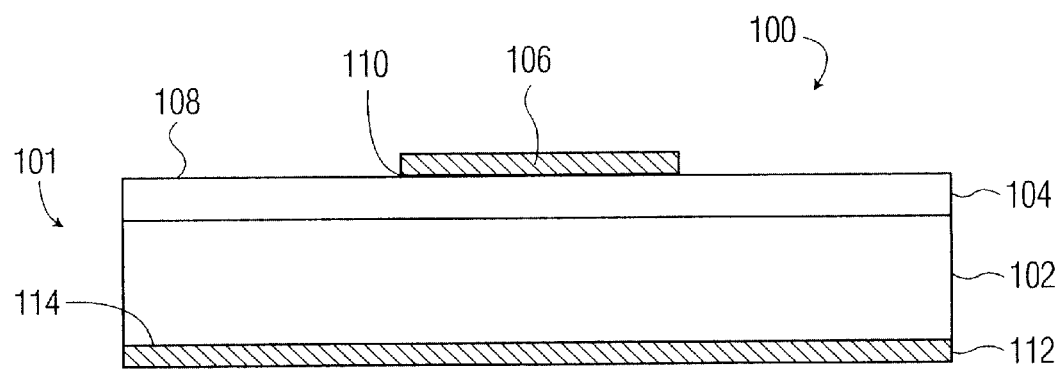
FIGS. 1A–C depict cross-sectional plan views of a first embodiment of a Schottky barrier diode of the present invention during fabrication.

The inventors have found that semiconductor power devices such as Schottky barrier diodes can be constructed with surface passivation layers which improve utility of such devices, but without any degradation in characteristics that accompanies the passivation of such devices. The inventors have found that by combining passivation with ion treatment of an area aligned with and surrounding the edge of the Schottky rectifying junction, power devices such as Schottky barrier diodes can be fabricated with near theoretical breakdown voltage values and leakage currents comparable to or less than those of unpassivated devices. The inventors have found that such fabrication processing is ideally-suited for silicon carbide (SiC) semiconductor substrates, because passivation layers in contact with SiC substrates contain large amounts of electrical charges which can degrade electrical performance.

The ion treatment modifies the region of the SiC surface aligned with and adjacent to the rectifying junction. This treatment such as ion implantation treatment, forms an edge termination region and so is called edge-termination. An edge-termination adjacent to and surrounding a power device formed on a face of a crystalline silicon carbide substrate is thought to result from the formation of amorphous silicon carbide at the treatment site. While not wishing to be bound by any theory, it is thought that the high-resistivity amorphous region acts to distribute the voltage along the substrate face, thus reducing the electric field at the edge of the device and thereby improving the breakdown voltage.

The present invention broadly relates to semiconductor Schottky-barrier devices including a semiconductor substrate, a rectifying junction formed on an ultra-clean portion of the first surface or face of the substrate forming a Schottky contact, an ion-treated region aligned with an edge of the junction, where the treated region extends out a distance of at least 5 μm from the edge and comprises substantially amorphous semiconductor region, a passivation layer formed on and covering the face of the substrate with openings exposing a portion of the junction and an Ohmic-contact layer on a second surface of the substrate.

The present invention also broadly relates to a method of making semiconductor devices having a rectifying junction thereon, where the method includes forming a patterned rectifying junction on an ultra-clean portion of the first surface or face of a semiconductor substrate to form Schottky contacts thereon. Next, the substrate is treated to form ion-treated regions or areas on a portion of surface or face of the substrate aligned with an edge of the junction, where the regions or areas extend out a distance of at least 5 μm from the edge, and the treatment is sufficient to disrupt the crystallinity of the substrate in the regions or areas rendering the substrate therein substantially amorphous. A patterned passivation layer is then formed on and covering the first surface or face of the substrate with openings exposing a portion of the junction. The method can also include forming an Ohmic layer on a second surface or face of the substrate.

The method of the present invention can be used beneficially with any device where there is an interface between an N-type semiconductor substrate and an oxide passivation layer.

Suitable semiconductor substrates for use in this invention are semiconductors that show decreased breakdown voltages when passivated by a dielectric layer. Such substrates include, without limitation, N-type silicon carbide, other N-type semiconductors, and mixtures or combinations thereof. Suitable SiC semiconductor substrates for use in the present invention, include, without limitation, any polytype SiC substrate such as 4H—SiC, 6H—SiC, 3C—SiC, 15R—SiC, or mixtures or combinations thereof.

Although the preferred rectifying junctions of the present invention are formed of metal, any conductive material can be used including conductive polymers, conductive ceramics, other conductive materials, surfaces rendered conductive by implantation, or combinations or mixtures thereof. Suitable metals for use in rectifying junctions include, without limitation, Ti, W, Ni, Al, Pt, Au, or mixtures or combinations thereof. The particularly preferred metal is Ti.

The rectifying junctions or Schottky metal contacts can also comprise combined layers of different metals, where two or more metals are layered one on top of the other. Generally, the bottom layers of such combined metal layered rectifying junctions are Ti, W, Ni, Al, Pt, Au, mixtures or combinations thereof, with Ti being preferred. The other metal layers can include, without limitation, any conductive metal such as the noble metals, metal mixtures or combinations thereof. Preferred combined metal layers include Ti/Ni, W/Ni, Ti/Ag, W/Ag, Ti/Ni/Ag, or W/Ni/Ag layers.

Although ion implantation is the preferred fabrication procedure for treating or edge-terminating the Schottky devices of this invention, any treatment that can render the treated SiC region amorphous or highly resistive will also work, such as charged particle surface treatment (protons, electrons, alpha particles, etc.) or the like. For ion implantation, suitable ions include, without limitation, electrically-active or inert ions, provided that the implantation dose and energy are sufficient to convert a portion of the top face of the SiC substrate amorphous. The thickness of the amorphous layer is not critical provided that the implantation destroys the crystallinity of the semiconductor during implantation. Preferred ions include, without limitation, argon, boron, carbon, helium, hydrogen, krypton, neon, silicon, vanadium, xenon, or the like, or mixtures or combinations thereof. Multiple implants at different energies and doses can also be used in order to obtain an amorphous region on the face of the SiC substrate, provided that the multiple implantations are sufficient to form the amorphous region. After implantation, the structure should not undergo processing steps that would allow the amorphous region of the semiconductor to become ordered or re-crystallize.

Suitable devices that can incorporate passivation and edge-termination on SiC substrates include, without limitation, any device formed on an N-type SiC semiconductor substrate such as Schottky diodes, p-n junction diodes, MOSFETs, MESFETs, JFETs, or other similar devices.

Suitable dielectric or passivation materials include, without limitation, any dielectric capable of passivating a SiC substrate. Preferred dielectrics include oxides, nitrides, oxynitrides, and mixtures thereof. Suitable oxides include, without limitation, thermally grown or deposited oxides, such as thermally-grown silicon oxides, low temperature thermal oxides (LTO), triethylorthosilane formed oxides (TEOS), and mixtures or combination thereof Other suitable dielectrics include, without limitation, deposited silicon nitride, oxynitride, and thermally-formed nitrided silicon oxide.

The invention will now be described in more detail in reference to the drawings where preferred embodiments are detailed. The drawings themselves are for illustrative purposes, where like elements may be numbered the same, and the size and scale are for convenience and do not represent the true shape and/or thickness of individual elements.

Figure 1B:
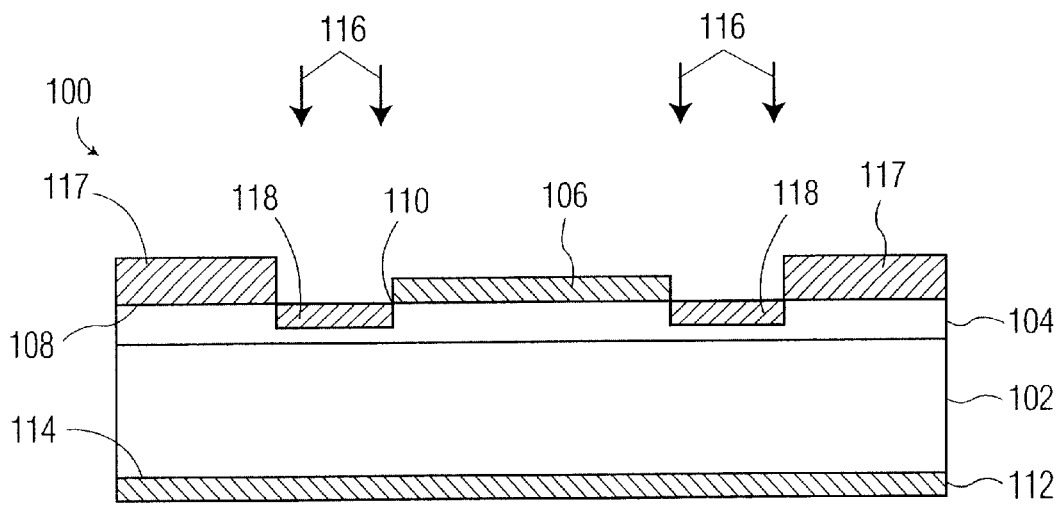
Figure 1C:
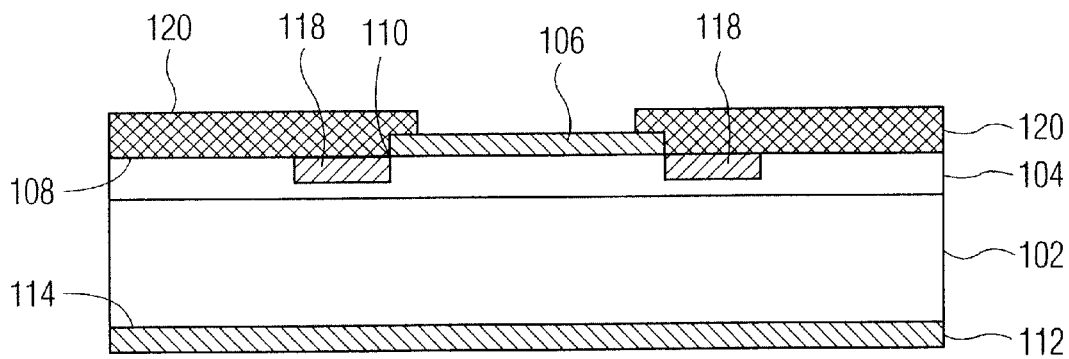

Referring now to FIGS. 1A–C, the fabrication of a high-voltage, passivated silicon carbide diode with improved electrical characteristics, generally device 100 of the present invention, is illustrated. While FIGS. 1A–C illustrate the fabrication of a Schottky barrier diode, it should be recognized by ordinary artisans that the present invention can be utilized to produce any silicon carbide power device.

Referring now to FIG. 1A, a silicon carbide substrate 101 is shown to include a relatively heavily doped N+ type layer 102 and an epitaxial N-type layer 104 doped to a lesser extent than the layer 102. The layer 102 generally ranges in thickness between about 50 μm to about 1000 μm, while the layer 104 ranges between about 1 μm and about 50 μm. The doping level of the substrate 102 is preferably about $1\times10^{18}$ $cm^{-3}$ or higher, and the doping level of the epitaxial layer 104 is preferably between $1\times10^{14}$ $cm^{-3}$ to about $1\times10^{17}$ $cm^{-3}$.

One procedure for forming the ultra-clean top face 108 of the layer 104 is formed by dipping the substrate 101 in a mixture of ammonium hydroxide, hydrogen peroxide and pure de-ionized water in the ratio 1:1:5 at 70° C. for 5 minutes. The substrate 101 is then rinsed in pure de-ionized water for 5 minutes and then dipped in a mixture of hydrochloric acid, hydrogen peroxide and pure de-ionized water in the ratio 1:1:5 at 70° C. for 5 minutes. The substrate 101 is then rinsed in pure de-ionized water for 5 minutes and then etched in dilute hydrofluoric acid for 30 seconds, followed by a pure de-ionized water rinse for 5 minutes. Just before the formation of the Schottky contact, the substrate 101 is dipped in a mixture of ammonium fluoride and ammonium phosphate for 5 minutes, rinsed in pure de-ionized water for 5 minutes and dried in hot nitrogen gas. Immediately following the last cleaning step, the wafer is loaded in the metallization chamber for the formation of the Schottky barrier contact 106. Of course, one of ordinary skill in the art will recognize that the above cleaning procedure is only exemplary, other procedures being available which will also render an ultra-clean surface of SiC.

The Schottky barrier contact 106, preferably titanium or a composite layer comprising titanium, nickel and silver, is formed on the ultra-clean top face 108 of the layer 104. Surrounding the contact 106 is an edge 110. Generally, an Ohmic-contact layer 112 is also formed on a bottom face 114 of the substrate 101. However, the Ohmic-contact layer 112 can be formed in a subsequent fabrication step. Although the device depicted in FIGS. 1A–C includes only a single Schottky junction, it should be recognized by those skilled in the art that of other power devices that multiple rectifying junctions may be formed. The design and fabrication of silicon carbide Schottky barrier diodes or rectifiers and other silicon carbide power devices are well-known to those having skill in the art and need not be described further herein.

Referring now to FIG. 1B, argon ions 116 are directed onto the top face 108 of the silicon carbide substrate 101. The ions 116 are confined to enter the substrate 101 only in the region 118 by means of a photoresist mask 117, defined by standard photolithography, and by the contact 106. Preferably, the thickness and/or other characteristics of contact 106 and mask 117 are chosen to prevent the ions from penetrating into the silicon carbide substrate 104 beneath the contact 106 and mask 117. The ions 116 penetrate the silicon carbide substrate 100 at the top face 108, adjacent and surrounding contact 106 to form an edge-termination region 118. The dose and energy of the ions 116 are selected so as to render the region 118 amorphous.

Finally, referring to FIG. 1C, the Schottky barrier diode device 100 of this invention is completed by forming a patterned passivation layer 120 on the top face 108 of the substrate 101 overlying the edge-termination region 118, where the above-mentioned passivation layer is formed or deposited by standard techniques well-known in the art.

EXAMPLES

The inventors fabricated Schottky barrier diodes with and without passivation, and passivated devices of the present invention with and without edge-termination, and compared their electrical characteristics. The diodes were all formed on n-type 4H—SiC wafers with 10 μm thick N-type epitaxial layers having a doping level of about $1\times10^{16}$ $cm^{-3}$, and an N+ substrate having a doping level of about $1\times10^{18}$ $cm^{-3}$. The Schottky barrier diodes where fabricated with titanium rectifying junctions of varying diameters ranging from about 100 μm to about 500 μm.

Metallization was performed on SiC epitaxial wafers that had undergone ultra-clean processing. Ultra-clean processing as used in the present invention denotes a specially prepared semiconductor surface that has been subjected only to standard cleaning processes but had not undergone fabrication steps that would expose the semiconductor surface to photoresists or solvents used to remove or dissolve photoresists or to chemical etches used to remove dielectric films prior to metallization. The inventors have found that forming rectifying junctions on such ultra-clean SiC wafers aids in the fabrication of passivated Schottky devices with near ideal electrical characteristics and good durability to the environment.

After metallization, windows of varying widths, ranging between about 5 μm and about 200 μm, were opened at the periphery of the Schottky barrier contacts or metallization junctions. Argon implantations were performed with an implant dose of about $1\times10^{15}$ cm$^{-2}$ and an implantation energy of about 30 KeV in the windows. It should be recognized that implantation dose and energy can be adjusted as desired, provided that the treatment is sufficient to form an amorphous semiconductor region on the face or surface of the substrate. After implantation, an oxide layer having a thickness of about 500 nm was formed on top of the wafer to provide surface passivation. Windows were then opened in the oxide passivation layer to form contacts to the Schottky metal pad or junction, resulting in a final device cross-section as shown in FIG. 1C.

Some of the fabricated devices used a Schottky metal junction comprising a tri-metal layer of Ti/Ni/Ag having a Ti:Ni:Ag thickness ratio of about 300 nm:150 nm:150 nm. It should be recognized that the thickness of the Schottky junction should be sufficient to act as a mask during ion implantation and the exact thickness of the individual metals in a metal layered junction is a matter of convenience.

The effect of combined passivation and edge-termination on the electrical characteristics of Schottky barrier diodes was found to be very small as compared to unpassivated and non-edge terminated Schottky barrier diodes, while passivated-but-unterminated Schottky barrier diodes showed large increases in leakage current and much inferior breakdown voltage characteristics. The forward current-voltage characteristics of all fabricated Schottky barrier diodes showed similar behavior, within experimental error.

Figure 2:
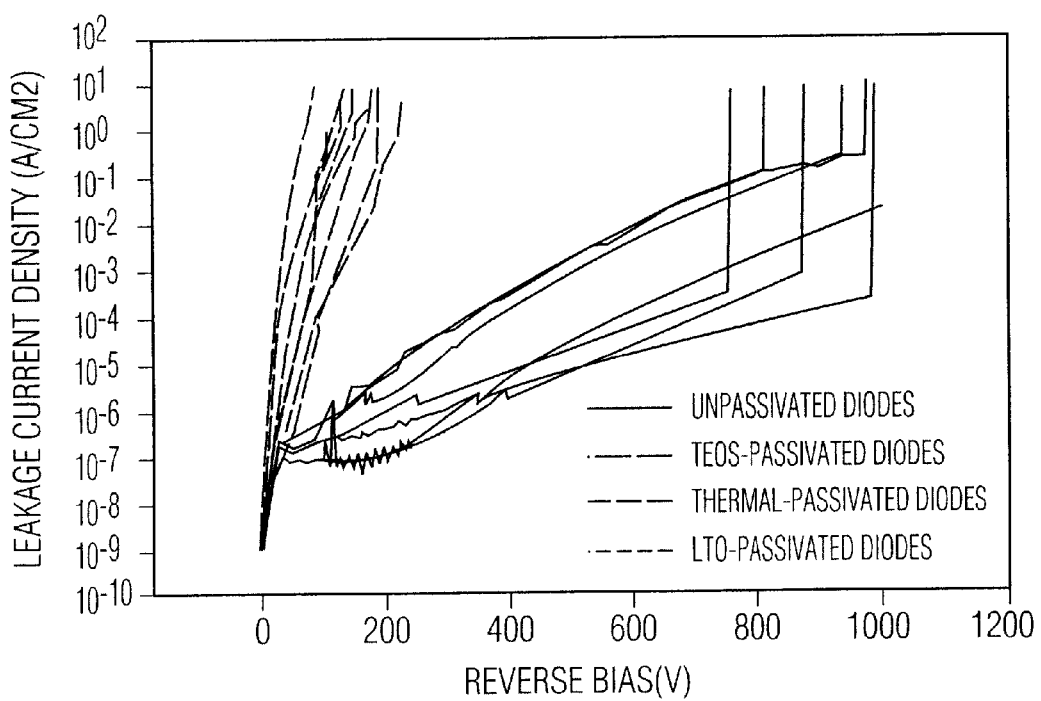
FIG. 2 shows Leakage Current Density against Reverse Bias for unpassivated and passivated Schottky barrier diodes without edge termination.

Referring to FIG. 2, the reverse bias properties of a series of diodes without edge terminations are compared. The unpassivated diodes showed standard reverse bias behavior, while the passivated diodes without edge terminations showed severe degradation of characteristics.

Figure 3:
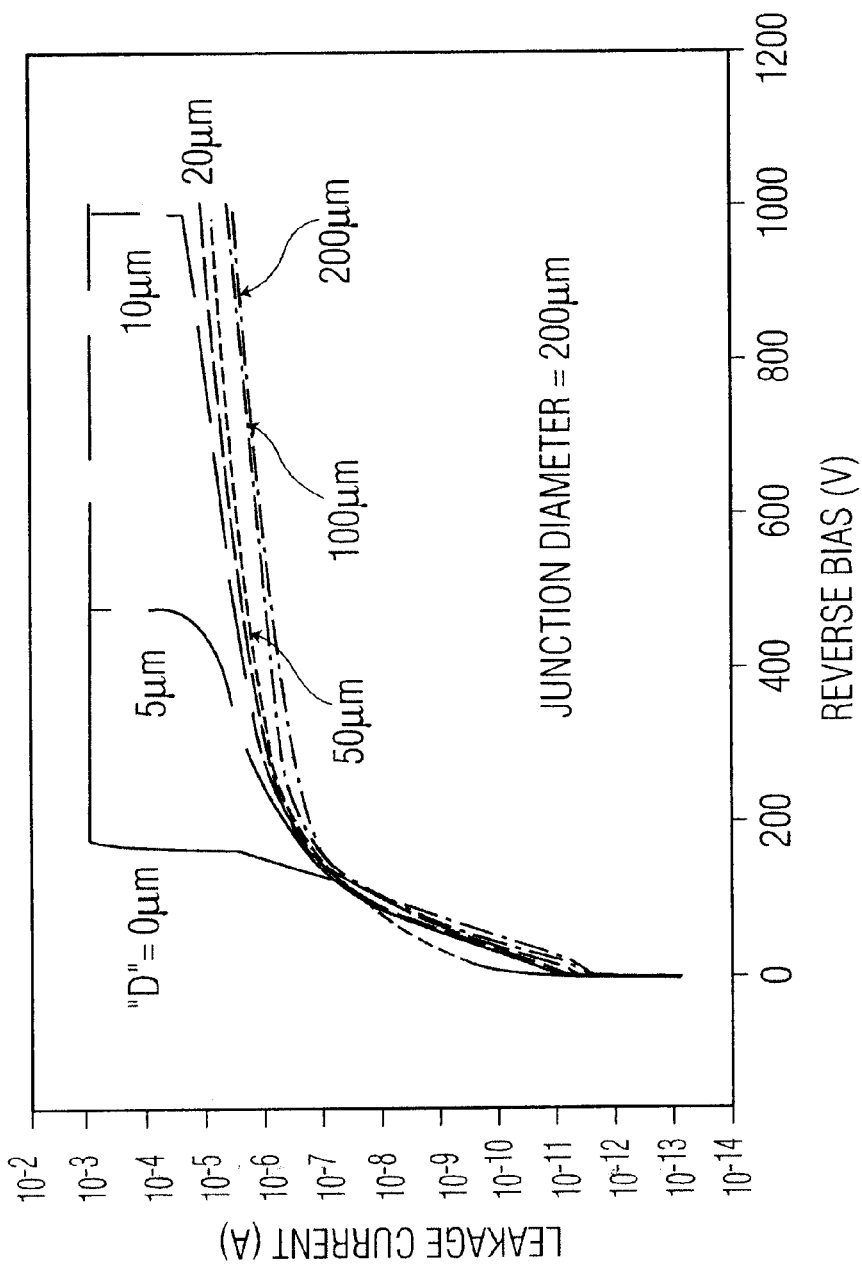
FIG. 3 shows Leakage Current against Reverse Bias for passivated, edge-terminated Schottky barrier diodes with different termination widths.

Referring now to FIG. 3, the behavior of passivated diodes was compared for diodes having 200 $\mu$m-diameter rectifying junctions and an edge-termination regions ranging from 0 $\mu$m (unterminated) to 200 $\mu$m. The reverse-bias behavior of passivated, unterminated diodes was very different relative to passivated and terminated diodes. The breakdown voltage of the passivated, unterminated diodes was less than 200 V. In fact, the low breakdown voltage and high leakage current were seen in all unterminated diodes with passivation layers, regardless of the type and thickness of the passivation layer. The addition of an ion-treated area surrounding the rectifying junction showed greatly improved characteristics over passivation alone, making it possible to construct SiC power devices with passivation protection and good voltage blocking capabilities. In accordance with the present invention, the blocking voltage capability of passivated and terminated Schottky barrier diodes was found greatly superior to passivated, unterminated diodes. Moreover, even a 5 $\mu$m edge termination more than doubled the breakdown voltage, to more than 450 V. Thus, the edge-termination should be at least 5 $\mu$m, and preferably at least 10 $\mu$m for a device capable of blocking 1000 V.

In summary, power devices incorporating a rectifying junction and protected with a dielectric passivation layer, and having nearly ideal properties or properties nearly the same as unpassivated devices, can be constructed on SiC substrates in accordance with the present invention.

ALTERNATIVE EMBODIMENT

Figure 4A:
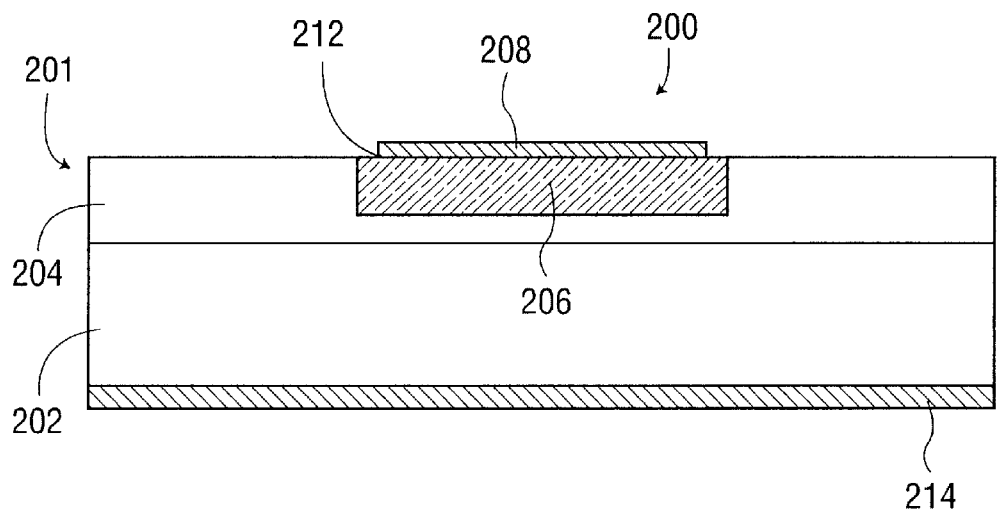
FIGS. 4A–C depict cross-sectional plan views of a second embodiment of a p-n junction rectifier of the present invention during fabrication.
Figure 4B:
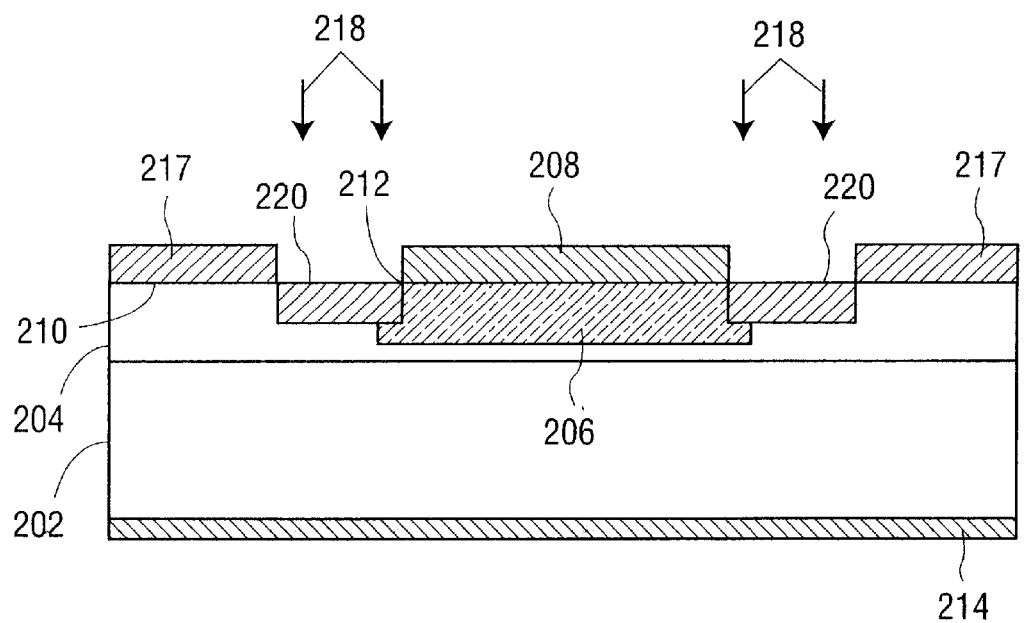
Figure 4C:
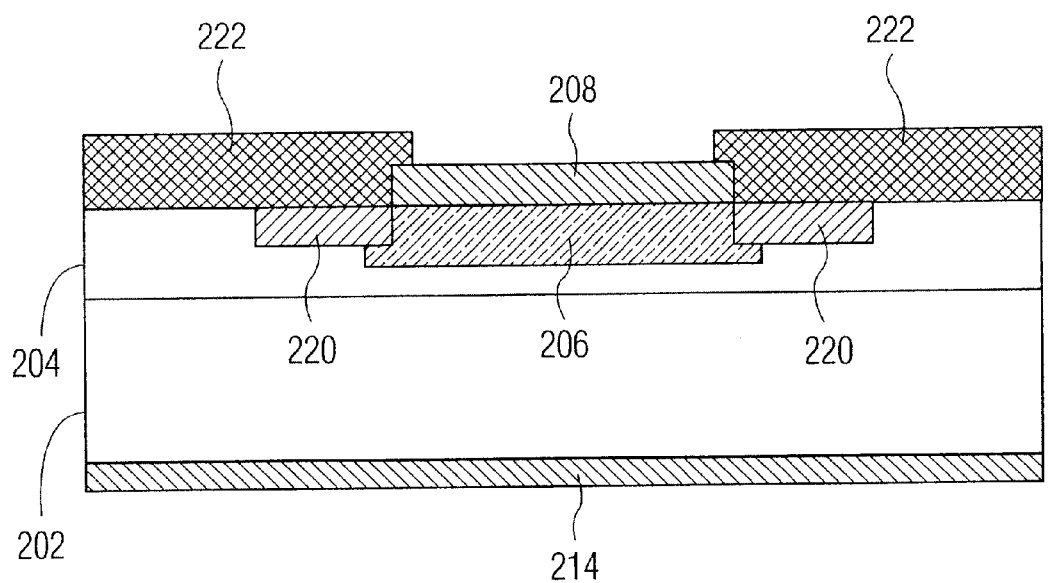

FIGS. 4A–C illustrate the fabrication of a passivated p-n junction rectifier, generally 200, according to the present invention. As illustrated in FIG. 4A, p-n junction rectifier includes a monocrystalline semiconductor substrate 201 having an N-type layer 204, an N$^+$ type layer 202, and a P$^+$ silicon carbide region 206 at a top face of the substrate. The P+ region may be formed using diffusion or ion implantation of a suitable dopant, such as boron or aluminum.

Referring now to FIG. 4A, a silicon carbide substrate 201 is shown to include a relatively heavily doped N$^+$ type layer 202 having a thickness of about 300 $\mu$m, an N-type epitaxial layer 204 doped to a lesser extent than the layer 202 and having a thickness of about 10 $\mu$m and a P+ type SiC region 206 formed in the layer 204. The doping level of the substrate 202 is about $1\times10^{18}$ cm$^{-3}$ and the doping level of the epitaxial layer 204 is about $1\times10^{16}$ cm$^{-3}$. An Ohmic contact 208, is formed over the P+ type SiC region 206. Surrounding the contact 208 is an edge 212. Generally, an Ohmic-contact layer 214 is also formed on a bottom face 216 of the substrate 201. However, the Ohmic-contact layer 214 can be formed in a subsequent fabrication step.

Referring now to FIG. 4B, argon ions 218 are directed onto the top face 210 of silicon carbide substrate 201. Preferably, the thickness and/or other characteristics of contact 208 are chosen so that the contact 208 blocks the ions 218 preventing them from penetrating into the silicon carbide substrate 201 beneath the contact 208. As shown in FIG. 4C, the ions 218 penetrate the silicon carbide substrate 201 at the top face 210, adjacent and surrounding the contact 208 to form an edge-termination region 220, which comprises amorphous silicon carbide. The dose and energy of ions 216 are selected so as to render the semiconductor region 220 amorphous, thereby reducing the electric-field crowding at the edge 210 and reducing or substantially eliminating the adverse affects of passivation described later.

Finally, referring to FIG. 4C, the Schottky barrier diode device 200 of this invention is completed by forming a patterned oxide passivation layer 222 on the top face 208 of the substrate 201 overlying the edge-termination region 218.

All references cited herein are hereby incorporated by reference. While this invention has been described fully and completely, it should be understood that, within the scope of the appended claims, the invention may be practiced otherwise than as specifically described. Although the invention has been disclosed with reference to its preferred embodiments, from reading this description those of skill in the art may appreciate changes and modification that may be made which do not depart from the scope and spirit of the invention as described above and claimed hereafter.

We claim:

1. A method for making a passivated silicon carbide semiconductor device comprising the steps of:

forming an ultra-clean surface on a first surface of a monocrystalline silicon carbide semiconductor layer;

forming a patterned electrical contact layer on the ultra-clean surface of the silicon carbide semiconductor layer;

forming an edge termination region in the silicon carbide semiconductor layer aligned with an edge of the electrical contact layer and surrounding the electrical contact layer, and forming a passivation layer covering a portion of the first surface.

2. The method of claim 1, wherein the passivation layer is formed to define an opening exposing a portion of the electrical contact layer.

3. The method of claim 1, wherein the edge termination is formed to extend out a distance of at least 5 $\mu$m from the edge of the electrical contact layer.

4. The method of claim 1, wherein the edge termination region forming step is an ion implanting step at a dose and energy sufficient to convert the treated crystalline silicon carbide substrate to a substantially amorphous form.

5. The method of claim 4 wherein the ions are electrically inactive ions.

6. The method of claim 1, wherein forming the passivation layer includes using the patterned electrical contact layer as a mask.

7. The method of claim 1, wherein forming an ultra-clean surface on a first surface of a monocrystalline silicon carbide semiconductor layer comprises, in order:

cleaning the first surface of the monocrystalline silicon carbide semiconductor layer in a first cleaning solution;

rinsing the monocrystalline silicon carbide semiconductor layer with deionized water a first time;

cleaning the first surface of the monocrystalline silicon carbide semiconductor layer in a second cleaning solution;

rinsing the monocrystalline silicon carbide semiconductor layer with deionized water a second time;

etching the monocrystalline silicon carbide semiconductor layer with an etching solution;

rinsing the monocrystalline silicon carbide semiconductor layer with deionized water a third time;

cleaning the first surface of the monocrystalline silicon carbide semiconductor layer in a third cleaning solution;

rinsing the monocrystalline silicon carbide semiconductor layer with deionized water a fourth time; and drying the first surface of the monocrystalline silicon carbide semiconductor layer.

8. A method for making a passivated silicon carbide semiconductor device comprising:

cleaning a surface of a silicon carbide layer of a substrate to produce an ultra-clean surface;

immediately after cleaning the surface, forming a patterned electrical contact directly on the ultra-clean surface of the silicon carbide layer;

forming an edge termination region in the silicon carbide layer, aligned with an edge of the patterned electrical contact and surrounding the patterned electrical contact, and forming a passivation layer overlying at least a portion of the edge termination region.

9. The method of claim 8, wherein the passivation layer is formed to define an opening exposing a portion of the patterned electrical contact.

10. The method of claim 8, wherein forming the passivation layer includes using the patterned electrical contact as a mask.

11. The method of claim 8, wherein cleaning the surface of a silicon carbide layer comprises:

cleaning the first surface of the monocrystalline silicon carbide semiconductor layer in a first cleaning solution;

rinsing the monocrystalline silicon carbide semiconductor layer with deionized water a first time;

cleaning the first surface of the monocrystalline silicon carbide semiconductor layer in a second cleaning solution;

rinsing the monocrystalline silicon carbide semiconductor layer with deionized water a second time;

etching the monocrystalline silicon carbide semiconductor layer with an etching solution;

rinsing the monocrystalline silicon carbide semiconductor layer with deionized water a third time;

cleaning the first surface of the monocrystalline silicon carbide semiconductor layer in a third cleaning solution;

rinsing the monocrystalline silicon carbide semiconductor layer with deionized water a fourth time; and drying the first surface of the monocrystalline silicon carbide semiconductor layer.

12. The method of claim 8, wherein the edge termination is formed to extend out a distance of at least 5 $\mu$m from the edge of the patterned electrical contact.

13. The method of claim 8, wherein forming the edge termination region includes an ion implanting step at a dose and energy sufficient to convert the treated crystalline silicon carbide substrate to a substantially amorphous form.

14. The method of claim 13 wherein the ions are electrically inactive ions.

* * * * *